(12) United States Patent
Cheng et al.

(10) Patent No.: US 8,030,707 B2
(45) Date of Patent: Oct. 4, 2011

(54) SEMICONDUCTOR STRUCTURE

(75) Inventors: Kangguo Cheng, Guilderland, NY (US);
Naftali Eliahu Lustig, Croton on Hudson, NY (US); Daewon Yang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 262 days.

(21) Appl. No.: 12/390,741

(22) Filed: Feb. 23, 2009

(65) Prior Publication Data
US 2010/0213522 A1    Aug. 26, 2010

(51) Int. Cl.
*H01L 27/01* (2006.01)
*H01L 27/12* (2006.01)
*H01L 31/0392* (2006.01)

(52) U.S. Cl. ........ 257/347; 257/296; 257/301; 438/238; 438/243

(58) Field of Classification Search .............. 257/296, 257/301, 347, E21.646; 438/238, 243, 386
See application file for complete search history.

(56) References Cited

U.S. PATENT DOCUMENTS

| | | | |
|---|---|---|---|
| 6,426,252 B1 * | 7/2002 | Radens et al. | 438/243 |
| 6,590,259 B2 | 7/2003 | Adkisson et al. | |
| 6,815,749 B1 | 11/2004 | Mandelman et al. | |
| 7,195,972 B2 * | 3/2007 | Chidambarrao et al. | 438/243 |
| 7,575,970 B2 * | 8/2009 | Ho et al. | 438/246 |
| 7,608,868 B2 * | 10/2009 | Lee et al. | 257/288 |
| 2008/0064178 A1 | 3/2008 | Ho et al. | |

* cited by examiner

*Primary Examiner* — Phuc Dang
(74) *Attorney, Agent, or Firm* — Ira D. Blecker; Joseph Petrokaitis

(57) ABSTRACT

A method of forming a silicon-on-insulator (SOI) semiconductor structure in a substrate having a bulk semiconductor layer, a buried oxide (BOX) layer and an SOI layer. During the formation of a trench in the structure, the BOX layer is undercut. The method includes forming a dielectric material on the upper wall of the trench adjacent to the undercutting of the BOX layer and then etching the dielectric material to form a spacer. The spacer fixes the BOX layer undercut and protects it during subsequent steps of forming a bottle-shaped portion of the trench, forming a buried plate in the deep trench; and then forming a trench capacitor. There is also a semiconductor structure, preferably an SOI eDRAM structure, having a spacer which fixes the undercutting in the BOX layer.

8 Claims, 6 Drawing Sheets

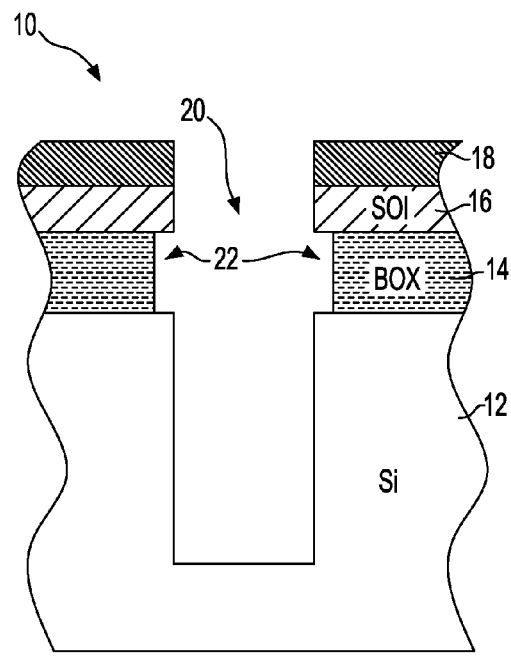
FIG. 1
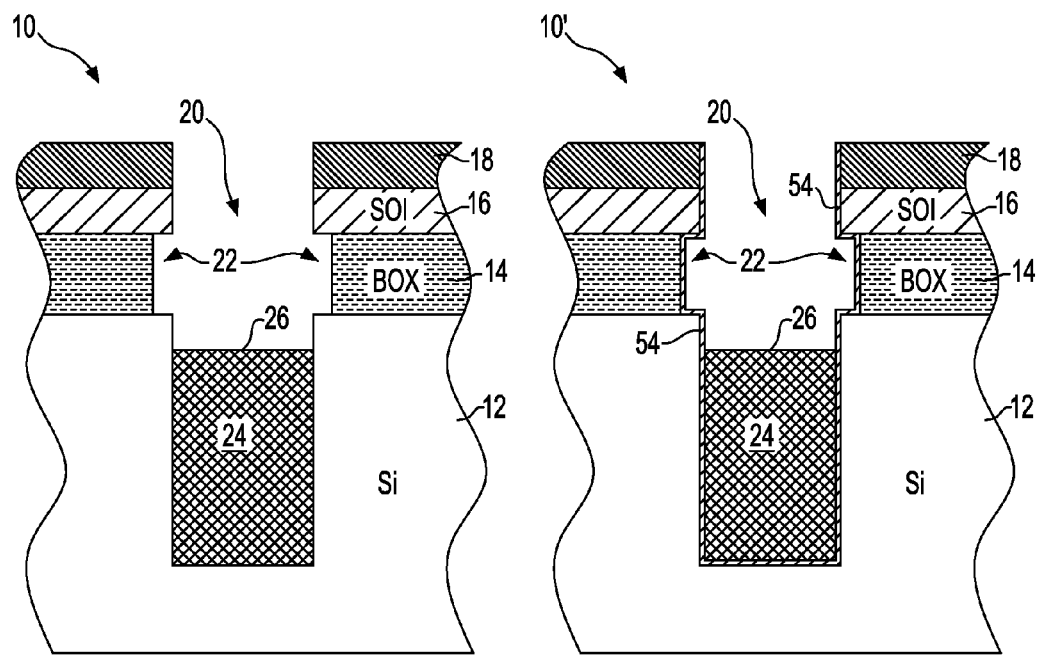
FIG. 2
FIG. 2A

SEMICONDUCTOR STRUCTURE

BACKGROUND OF THE INVENTION

The present invention relates to electronic devices, and more particularly to semiconductor structures including memory devices, such as eDRAM devices, formed within a silicon-on-insulator (SOI) substrate.

Dynamic Random Access Memory (DRAM) cells are well known. A DRAM cell is essentially a capacitor for storing charge and a pass transistor (also called a pass gate or access transistor) for transferring charge to and from the capacitor. Data stored in the cell is determined by the absence or presence of charge on the storage capacitor. Because cell size affects chip density, and cost, reducing cell area is one of the DRAM designer's primary goals.

One way to accomplish this density goal without sacrificing storage capacitance is to use trench capacitors in the cells. Trench capacitors can be formed by etching deep trenches in a silicon wafer and forming vertically oriented capacitors within each deep trench. Thus, the surface area required for the storage capacitor is dramatically reduced without sacrificing capacitance, and correspondingly, storable charge. Each deep trench may have a depth on the order of 1 µm or greater.

Trench-type memory devices are advantageous, in comparison to planar memory configurations, for increased density, performance and lithographic considerations. Trench-type memory devices increase density by reducing the cell area of each memory device, therefore allowing for closer positioning of adjacent memory devices.

There is interest in integrating the excellent drive current and density of memory devices with the superior logic devices that can be formed on silicon-on-insulator (SOI) substrates, to obtain high density memory embedded dynamic random access memory (eDRAM). SOI substrates reduce parasitic capacitance within the integrated circuit and reduce individual circuit loads, thereby improving circuit and chip performance.

With eDRAM on an SOI substrate, the buried oxide (BOX) is used as a collar oxide, simplifying the overall fabrication process. However, the collar oxide can be attacked easily during wet processing, especially during node dielectric material removal before strap deposition.

Radens et al. U.S. Pat. No. 6,426,252, the disclosure of which is incorporated by reference herein, discloses an SOI DRAM memory cell in which the BOX layer is intentionally etched to form the strap therein. There is no recognition of the need to avoid the undercutting of the BOX layer.

Adkisson et al. U.S. Pat. No. 6,590,259, the disclosure of which is incorporated by reference herein, discloses an SOI eDRAM structure wherein the BOX layer is not undercut. There is no recognition of the problem of BOX layer undercutting or the need to avoid the undercutting of the BOX layer.

Mandelman et al. U.S. Pat. No. 6,815,749, the disclosure of which is incorporated by reference herein, discloses that the BOX layer is purposely undercut to form a strap therein. The reference recognizes that the tolerances are such that there is no risk of shorting adjacent trenches through the BOX layer.

Ho et al. U.S. Patent Application Publication US 2008/0064178, the disclosure of which is incorporated by reference herein, discloses the addition of a sidewall spacer to protect the BOX layer prior to the formation of the deep trench. After the formation of the deep trench, the sidewall spacer is removed.

Accordingly, there is a need for an improvement in the design and manufacturing of semiconductor structures, such as eDRAM on SOI substrates, to protect the BOX layer during processing.

BRIEF SUMMARY OF THE INVENTION

The various advantages and purposes of the invention as described above and hereafter are achieved by providing, according to a first aspect of the invention, a method of forming a semiconductor structure comprising the steps of:

providing a silicon-on-insulator (SOI) substrate comprising a bulk semiconductor layer, a buried oxide (BOX) layer and an SOI layer;

forming a deep trench in the SOI substrate, the trench extending through the SOI layer and the BOX layer of the SOI substrate;

filling the deep trench with a sacrificial fill material;

recessing the sacrificial fill material below the BOX layer;

depositing a dielectric on a sidewall of the deep trench down to the sacrificial fill material;

etching the dielectric to form a spacer on the sidewall of the deep trench down to the sacrificial fill material;

removing the sacrificial fill material;

forming a bottle-shaped trench in the deep trench previously occupied by the sacrificial fill material;

forming a buried plate in the deep trench; and forming a trench capacitor.

According to a second aspect of the invention, there is provided a semiconductor structure comprising:

a silicon-on-insulator (SOI) substrate having a bulk semiconductor layer, a buried oxide (BOX) layer and a silicon-on-insulator (SOI) layer;

a trench extending through the SOI layer, BOX layer and into the bulk semiconductor layer, the trench undercutting the BOX layer so as to form a divot in the BOX layer;

a spacer in the trench and adjacent to the wall of the trench so as to fill the divot in the BOX layer;

a node dielectric extending along the wall of the trench and the spacer;

a first conductor filling the trench; and a buried strap of a second conductor to connect the first conductor and the SOI layer.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

FIGS. 1, 2, 2A and 3 to 11 illustrate the process steps of forming a semiconductor structure, preferably an SOI eDRAM structure, according to the present invention and the final semiconductor structure, preferably an SOI eDRAM structure, achieved according to the present invention.

DETAILED DESCRIPTION OF THE INVENTION

Figure 3:
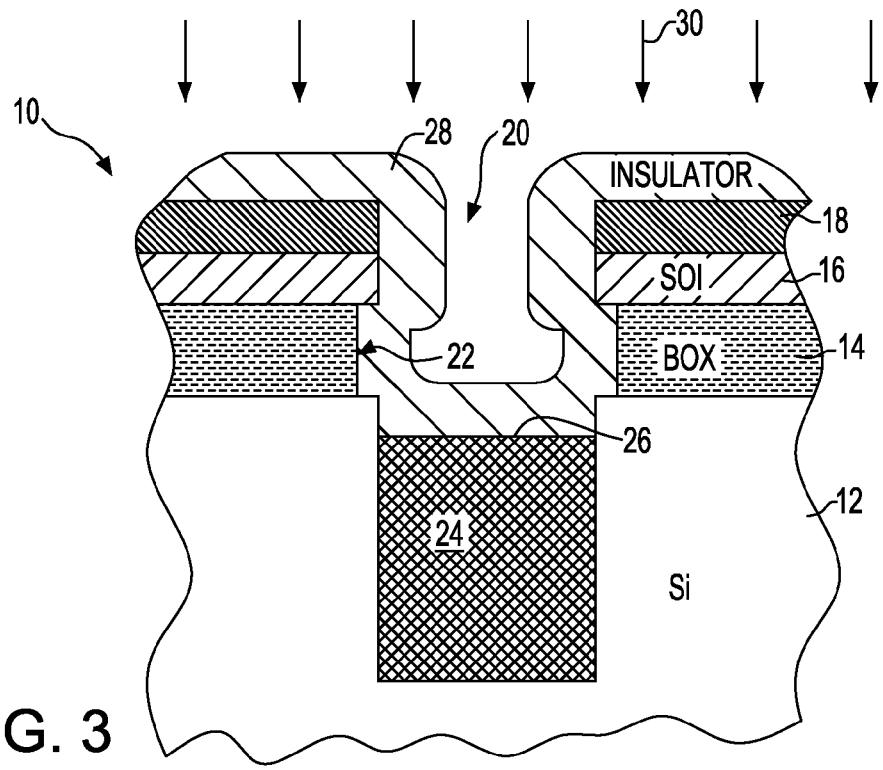

Referring to the drawings in more detail, and particularly referring to FIG. 1, there is shown a partially fabricated semiconductor structure, most preferably an eDRAM memory cell structure, on a silicon-on-insulator (SOI) substrate 10 which comprises bulk semiconductor layer 12, buried oxide (BOX) layer 14 and SOI layer 16. The bulk semiconductor layer 12 can be any semiconductor material such as silicon, silicon germanium, germanium, a III-V compound semiconductor, or a II-VI compound semiconductor.

The SOI substrate 10 is fabricated using techniques well known to those skilled in the art. For example, the SOI substrate 10 can be formed by a thermal bonding process, a layer transfer process, or alternatively, the SOI substrate 10 can be formed by an oxygen implantation process, which is referred to in the art as separation by implantation of oxygen (SIMOX).

The SOI layer 16 is a silicon-containing layer and may include any semiconductor material that includes silicon. Illustrative examples of various silicon semiconductor materials that can be employed include, but are not limited to, silicon, silicon germanium, silicon germanium carbide, silicon carbide and other like silicon-containing materials. Combinations of the aforementioned semiconductor materials can also be used as the SOI layer 16.

The SOI layer 16 is doped to provide suitable electrical conductivity. Conventional processes, such as ion implantation, may introduce the dopant. Alternatively, the SOI layer 16 can be in-situ doped.

Formed over the SOI layer 16 is pad layer 18. Typically, the pad layer comprises a nitride or a nitride with an oxide underneath the nitride. There is also a masking layer (not shown for clarity), for example, an oxide layer which forms a hard mask to facilitate the formation of the semiconductor structure, preferably an eDRAM memory cell structure. A deep trench 20 is then formed in the SOI substrate 10 using an etch process that is highly selective to the masking layer, such as reactive ion etching. The typical deep trench etch process can involve another layer (not shown for clarity) of hard mask formation on top of the masking layer for deeper trench depth. While only one deep trench 20 is shown in the Figures, it will be appreciated that there are usually a plurality of such deep trenches 20 and that some of the deep trenches 20 are in close proximity to other of the deep trenches 20.

Also shown in FIG. 1 is the undercutting 22 of the BOX layer 14 that inevitably occurs during the formation of the trench 20. The undercutting 22 is a result of wet etching by hydrofluoric acid during several preceding processing steps.

BOX undercutting is undesirable as it may cause various problems such as merging neighboring deep trenches and outdiffusion of dopants from the deep trench to array transistors. A challenge in fabricating SOI eDRAM structures is the complicated process in forming a protection layer in the upper portion of the deep trench in order to process the lower portion of the deep trench including process steps to form the buried capacitor plate and form a bottle-shaped lower trench portion to enhance trench capacitance.

The present invention, to be described hereafter, is a simple method and structure for forming a spacer on the upper trench sidewall. The spacer serves two purposes, namely, serving as a patch to fix the BOX undercut and serving as a protect layer to facilitate the formation of a buried capacitor plate and bottle-shaped lower portion of the deep trench.

Referring now to FIG. 2, the deep trench 20 is filled with a sacrificial material 24 and then recessed to a level within the bulk semiconductor indicated by 26. There are several different materials that could be used for the sacrificial material 24, including but not limited to, polymer, photoresist, "low-k" materials (k denotes dielectric constant) such as SiLK® from Dow Chemical Company or Black Diamond® from Applied Materials, Inc. The sacrificial material 24 can be deposited by spin-on-coating or chemical vapor deposition (e.g., plasma enhanced chemical vapor deposition) and recessed by plasma etching, although any other suitable deposition methods and etching methods are also possible within the scope of the present invention.

As shown in FIG. 2A as an alternative preferred embodiment of the present invention, SOI substrate 10' has a thin layer 54 of oxide or nitride deposited on the trench sidewall prior to the filling of the trench with the sacrificial material 24. The thin layer 54 can be formed by thermal oxidation, thermal nitridation, chemical oxidation, thermal oxynitridation, chemical vapor deposition (CVD), low temperature oxide deposition (LTO), high temperature oxide deposition (HTO), ozone/TEOS deposition, or any combination of those methods. Depending on the deposition method, the thin layer 54 may cover the entire trench sidewall and bottom of the trench as shown in FIG. 2A or only the exposed silicon surfaces. In one embodiment, the thin layer 54 is formed by thermal oxidation. It is formed only on exposed silicon surfaces, that is on the sidewalls of the SOI layer 16, sidewalls and bottom of the bulk semiconductor layer 12 (assuming silicon or a silicon compound is used as the bulk semiconductor layer 12) but not on the sidewall of the BOX layer 14. Alternatively, the thin layer 54 is a nitride layer deposited by CVD. It covers the entire trench sidewalls and bottom of the SOI layer 16 and bulk semiconductor layer 12 including the undercut of the BOX layer 14. The thin layer 54 has a thickness typically ranging from about 2 nm to 10 nm, although greater or less thickness is also within the scope of the present invention.

Referring to FIG. 3, the process continues by depositing a dielectric material 28 into deep trench 20 on top of sacrificial material 24. The dielectric material 28 may be a nitride or low temperature oxide. It is important that the deposition temperature is low enough to avoid any severe damage of the sacrificial material 24. In one embodiment, the dielectric material 28 comprises silicon oxide and is deposited by a low temperature deposition process with a temperature less than about 200° C. The dielectric material 28 can also be deposited by any other suitable low temperature deposition methods, including but not limited to, atomic layer deposition (ALD), molecular layer deposition (MLD), physical vapor deposition, sputtering, plating, evaporation, ion beam deposition, electron beam deposition, chemical solution deposition, or any combination of those methods. It is not necessary for the dielectric material 28 to fill the entire remainder of the deep trench 20 not occupied by the sacrificial material 24 as most of the dielectric material 28 will eventually be removed.

Figure 4:
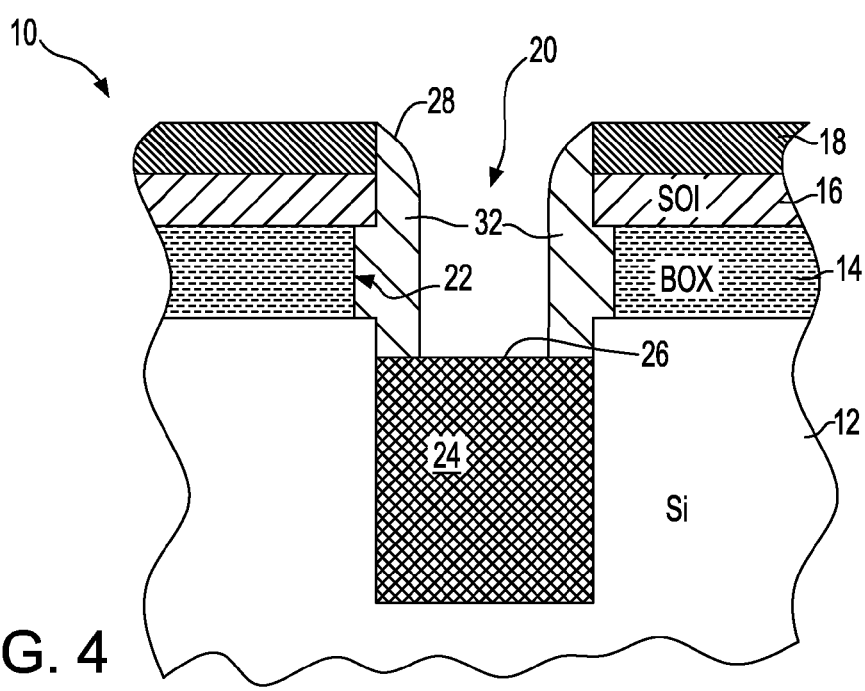

The SOI substrate 10 is then etched, indicated by arrows 30 in FIG. 3, to partially remove the dielectric material 28 to form spacer 32 as shown in FIG. 4. For purposes of illustration and limitation, the etching 30 may be by a process such as reactive ion etching (RIE). Due to the overshadowing of the BOX undercut 22 by the pad oxide layer 18 and SOI layer 16, the spacer 32 is thicker in the BOX layer 16. The spacer 32 thus acts as a divot fill to patch the BOX undercut 22.

Figure 5:
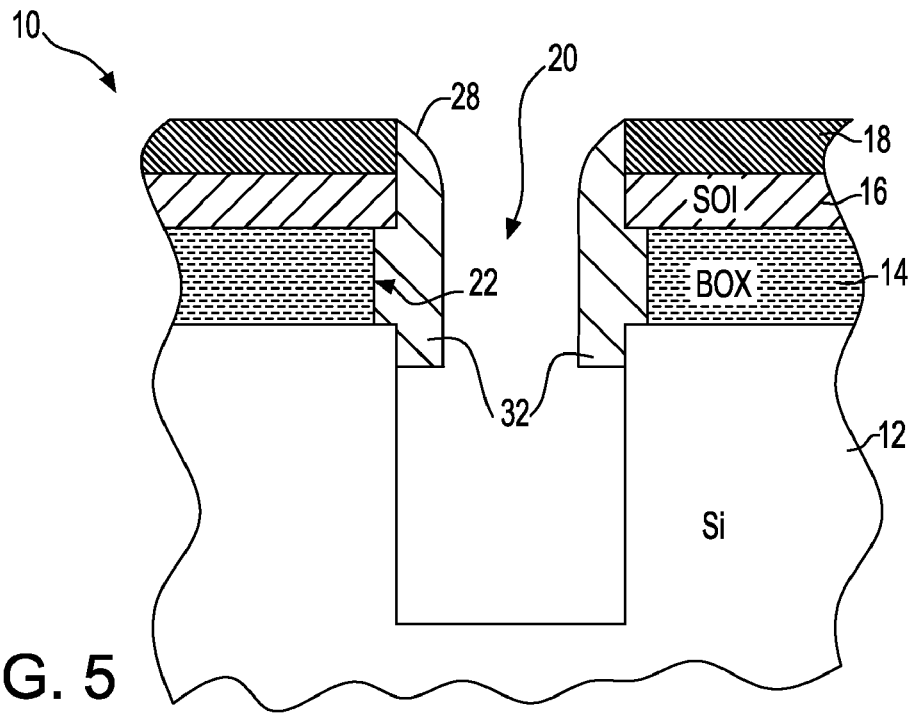

The sacrificial material 24 is then removed from the deep trench 20 by a process such as oxygen ashing which is selective to the dielectric 28 of the spacer 32. The SOI substrate 10 may optionally be annealed at a temperature typically ranging from 500° C. to 1100° C. for a duration typically ranging from 1 second to 2 hours to densify the dielectric 28 of the spacer 32. The structure to this point is shown in FIG. 5.

Figure 6:
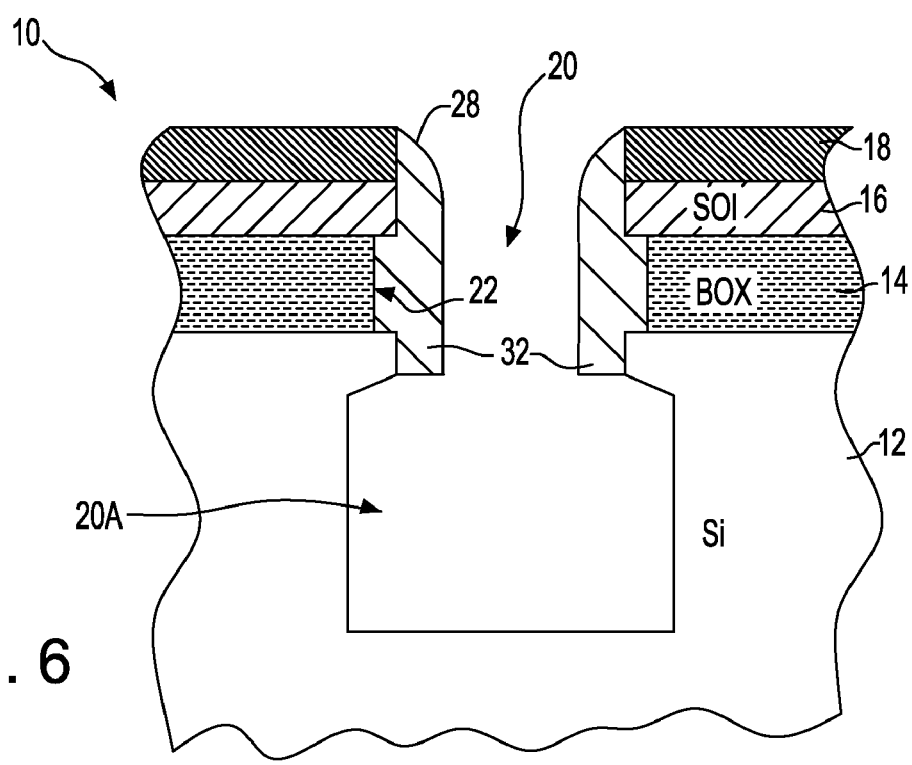

The deep trench 20 is then etched with ammonia or tetramethyl ammonium hydroxide (TMAH) at a temperature typically ranging from 20° C. to 150° C. for a duration typically ranging from 3 seconds to 200 seconds to form a bottle-shaped portion 20A of the deep trench 20 as shown in FIG. 6.

Figure 7:
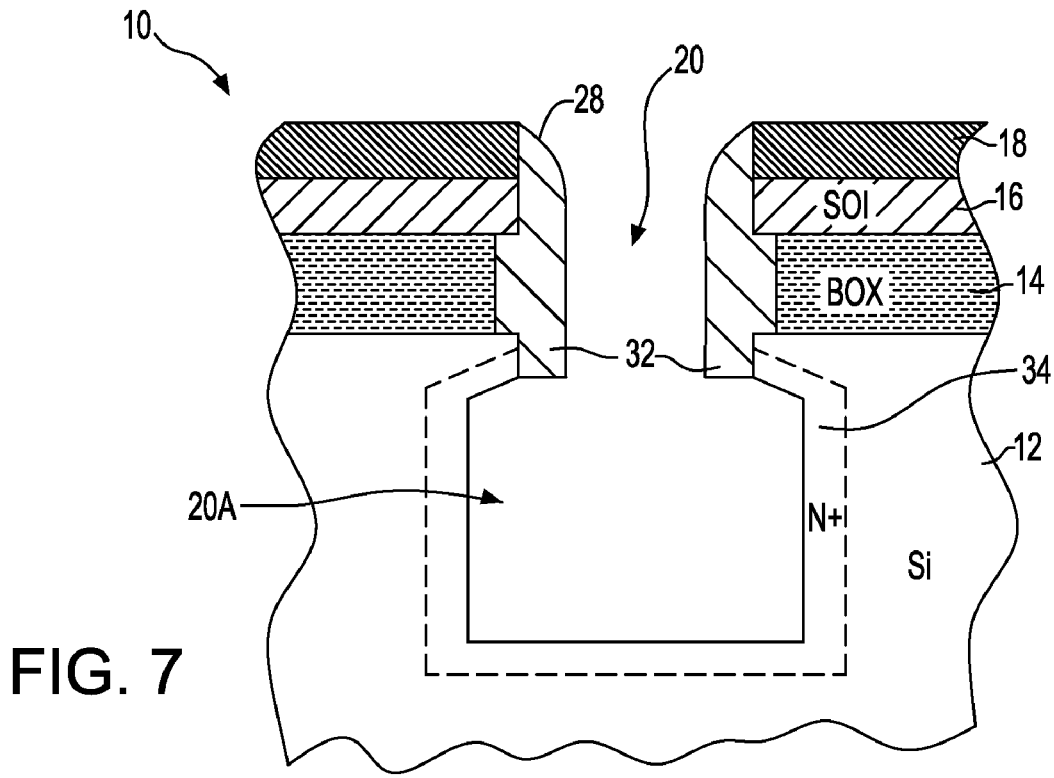

The bottle-shaped portion 20A of the deep trench 20 is doped to form a buried capacitor plate 34, as shown in FIG. 7, with a typical doping process such as ion implantation, gas phase doping, plasma doping, plasma immersion ion implantation, cluster doping, infusion doping, liquid phase doping or by deposition of doped glass followed by drive-in. The spacer 32 protects the SOI layer 16 and the BOX layer 14 during the process of forming the bottle-shaped trench 20A and the process of forming the buried capacitor plate 34.

Figure 8:
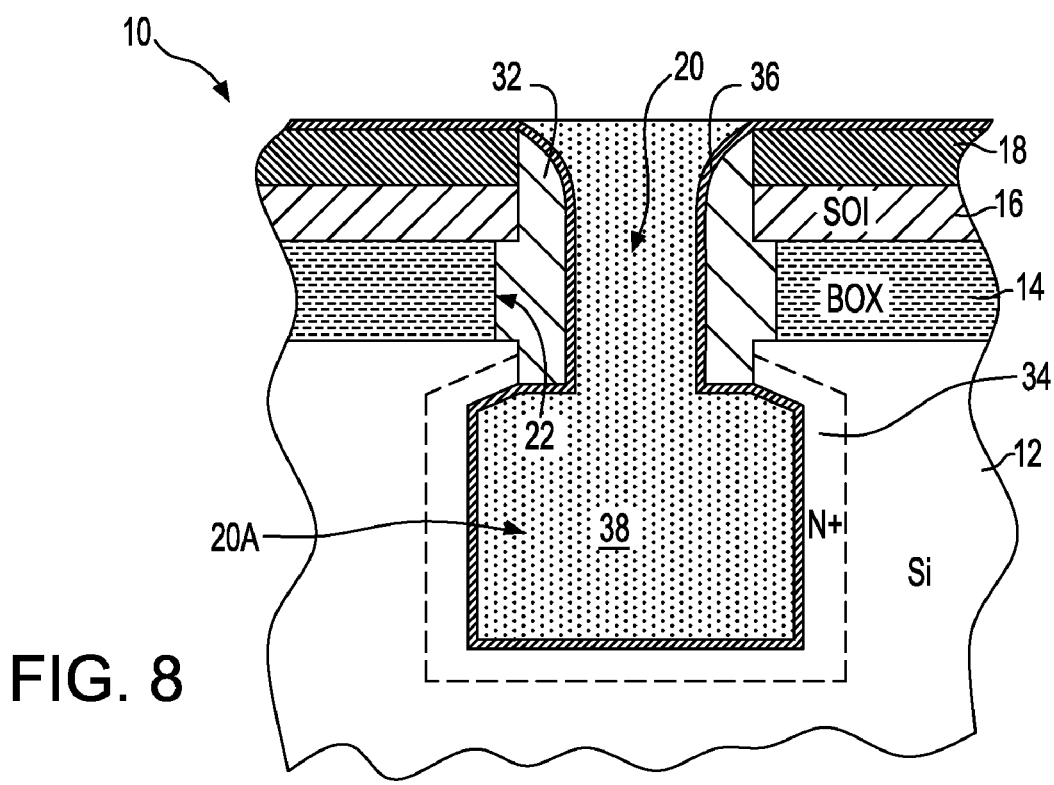

Referring now to FIG. 8, the deep trench 20, including bottle-shaped portion 20A is lined with a node dielectric 36. The node dielectric 36 typically has a thickness of about 2 to 10 nanometers (nm). The node dielectric 36 may be conformally formed along the walls of the deep trench 20, including bottle-shaped portion 20A, using deposition methods such as thermal oxidation, thermal nitridation, chemical oxidation, chemical vapor deposition (CVD), atomic layer deposition (ALD) or any suitable combination of those methods. The node dielectric 36 may be, for example, silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate, and any combination of these materials. The deep trench 20, including bottle-shaped portion 20A, is filled with a first conductor 38. The first conductor 38 may comprise doped polysilicon, a metal (e.g., tungsten), a conducting metallic compound material (e.g., titanium nitride), or any suitable combination of these materials. The first conductor 38 may be deposited by a process such as CVD or low pressure CVD (LPCVD) and then conventionally planarized by a process such as chemical-mechanical polishing.

Figure 9:
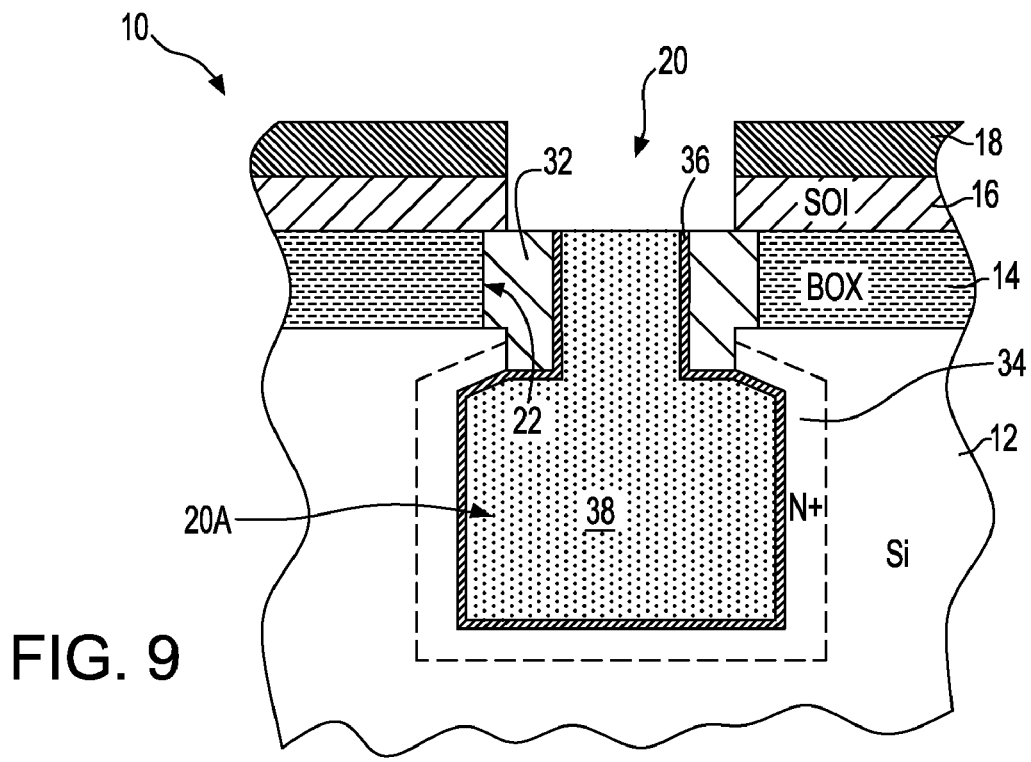

Referring now to FIG. 9, the first conductor 38 is conventionally recessed by, for example, RIE and then node dielectric 36 is recessed by wet etching with hydrofluoric acid, phosphoric acid or a mixture of hydrofluoric acid and ethylene glycol. The exposed top portion of the spacer 32 can be removed by the same process for etching the node dielectric 36 or by a separate process, for example, by hydrofluoric acid, after etching the node dielectric 36. It is to be noted that the spacer 32 is recessed only down to the bottom of the SOI layer 16 so that the spacer 32 protects the BOX undercut 22 from further undercutting during subsequent processing.

The remaining part of deep trench 20 is then filled with a second conductor 40 and then conventionally recessed. The second conductor 40 is preferably doped polysilicon which may be deposited by, for example, a low pressure chemical vapor deposition (LPCVD) process. The second conductor 40 may also be a metal or metal-containing conductor material such as titanium nitride or tungsten nitride. The second conductor 40 will form the so-called buried strap to electrically connect the SOI layer 16 and the first conductor 38.

Figure 10:
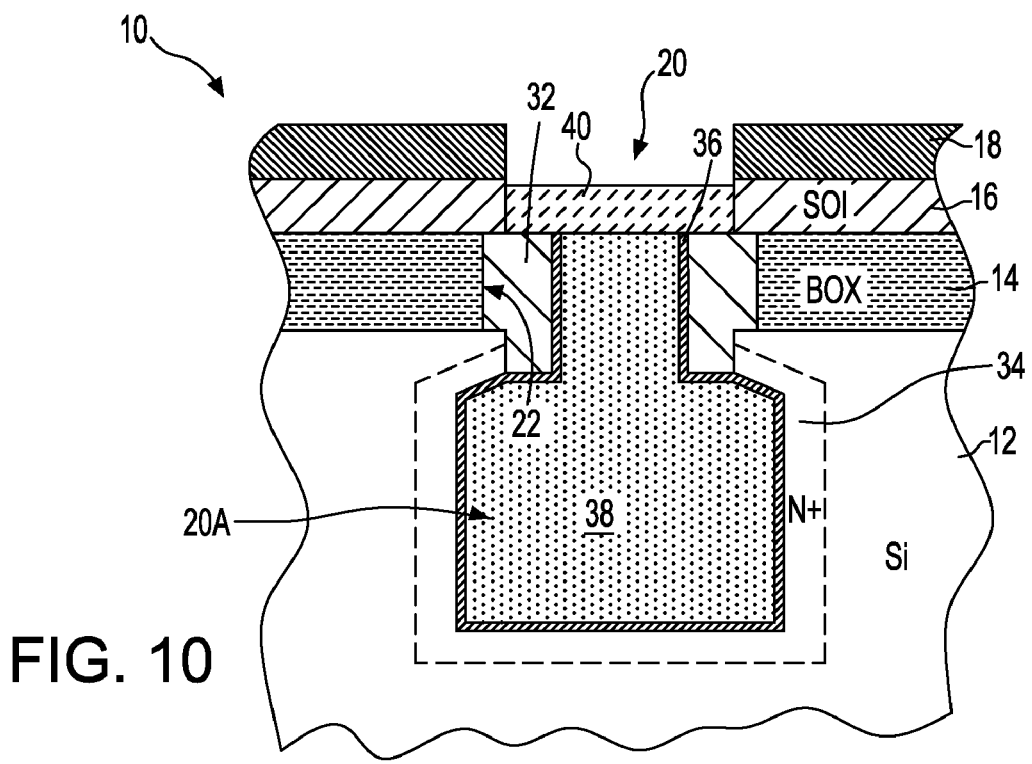
Figure 11:
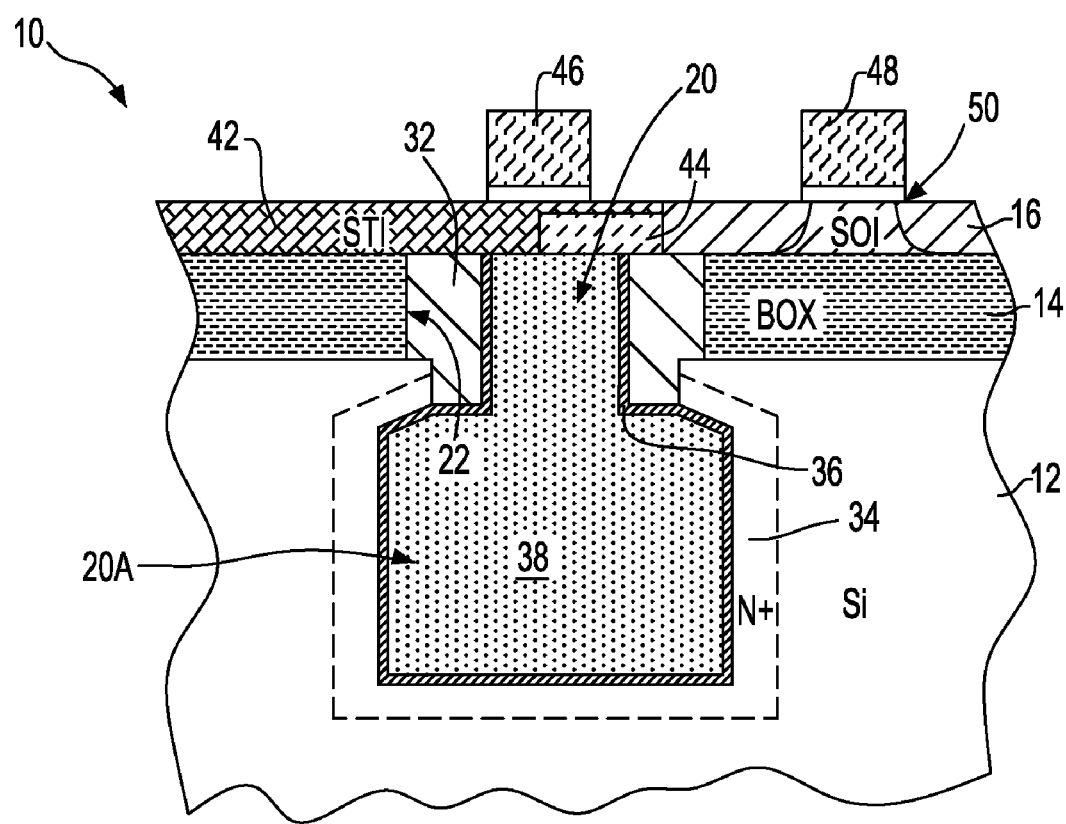

Referring now to FIG. 11, the remaining steps necessary to form the eDRAM memory cell structure are described. While these steps are not germane to the present invention, they are described for completeness. The shallow trench isolation (STI) region 42 is formed and the pad layer 18 (shown in FIG. 10) is removed. Part of the second conductor 40 is removed, for example, during the process of etching the STI region 42, and then filled with the same insulator as that used for filling the STI region 42, to result in buried strap 44. Then pass gate 46 for the deep trench 20 and gate 48 for transistor 50 (in SOI layer 16) are formed to complete the eDRAM memory cell structure.

As can be seen, the semiconductor structure, preferably an eDRAM memory cell structure, has been formed while protecting the BOX undercut 22 from further undercutting by spacer 32. The present invention is a simple method to fix the BOX undercut 22 while facilitating the formation of the buried plate 34 and bottle-shaped deep trench portion 20A.

Compared to the prior art, the present invention is simple and cost-effective and no exotic materials or equipment is required as the process is fully compatible with current technology.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

The invention claimed is:

1. A semiconductor structure comprising:
   a silicon-on-insulator (SOI) substrate having a bulk semiconductor layer, a buried oxide (BOX) layer and a silicon-on-insulator (SOI) layer;
   a trench extending through the SOI layer, BOX layer and into the bulk semiconductor layer, the trench undercutting the BOX layer so as to form a divot in the BOX layer;
   a spacer in the trench and adjacent to a wall of the trench so as to fill the divot in the BOX layer;
   a node dielectric extending along the wall of the trench and the spacer;
   a first conductor filling the trench; and
   a buried strap of a second conductor to connect the first conductor and the SOI layer.

2. The semiconductor structure of claim 1 wherein the BOX layer has a thickness and the spacer extends the full thickness of the BOX layer.

3. The semiconductor structure of claim 1 wherein the BOX layer has a thickness and the spacer extends the full thickness of the BOX layer and into the bulk semiconductor layer.

4. The semiconductor structure of claim 1 forming an SOI eDRAM memory cell structure.

5. The semiconductor structure of claim 1 wherein the spacer comprises a material selected from the group consisting of nitrides and low temperature oxides.

6. The semiconductor structure of claim 5 wherein the spacer material is characterized by a deposition temperature of 200° C. or less.

7. The semiconductor structure of claim 1 wherein the trench comprises a bottle shaped portion in the bulk semiconductor layer.

8. The semiconductor structure of claim 1 wherein the trench comprises a buried capacitor plate.

* * * * *